United States Patent Office 3,346,415

Patented Oct. 10, 1967

3,346,415

FLEXIBLE PRINTED CIRCUIT WIRING

Carl L. Hachenberger, 20903 Puente Road, Woodland Hills, Calif. 91364

No Drawing. Filed Dec. 16, 1963, Ser. No. 330,654

10 Claims. (Cl. 117—212)

ABSTRACT OF THE DISCLOSURE

The subject invention discloses a method of manufacturing a flexible printed circuit board from an original printed circuit board having a rigid substrate including a flexible material made rigid by a stiffening substance comprising the removal of said stiffening substance from said underlying substrate in the areas of said original printed circuit board desired to be made flexible, followed by the impregnating of the underlying substrate in said areas with a flexible bonding agent to reinforce the flexible material within said areas.

This invention is directed to improvements in the method and means for manufacturing printed circuits and more particularly flexible printed circuits.

The present technique for manufacturing flexible printed circuit boards and cables that is printed circuits wherein the wiring is formed on a flexible substrate so that the printed circuit can be bent, is to start out with a flexible substrate such as Teflon upon which the conductive laminate is deposited, and thereafter to remove portions of the conductive laminate to leave the remaining printed circuit conductors in the desired pattern. A number of problems arise, however, when a flexible substrate is employed.

Since the substrate material is flexible, it is difficult to machine and to maintain dimensional tolerances. Further, it has been found very difficult to plate through holes from one side of the substrate to the other. Because of the flexible nature of the substrate it is also difficult to couple a flexible substrate printed circuit wiring board to a receiving plug. It has long been recognized by those skilled in the art that it would be advantageous in some way to stiffen the substrate in the region where it is inserted into the mating plug while leaving the remainder thereof flexible.

An object of this invention is to provide a new and novel method and means for making a flexible printed circuit board. Still another object of this invention is the provision of a novel method and means for making a flexible printed circuit board which permits accurate machining and retains dimensional stabilty.

Still another object of the present invention is the provision of a method and means for producing a printed circuit board which is flexible or rigid, as desired, in predetermined areas thereof.

The foregoing and other objects of the present invention may be achieved by first making a printed circuit board in the usually accepted manner employing a rigid substrate having a flexible member which is made stiff by stiffeners. An example of this is a substrate of "Fiberglas" bonded and stiffened with epoxy resin. All the required machining and processing, through plating, etc., is carried out on this rigid printed circuit board in the normal course. Thus, no trouble is experienced with any of these operations.

Thereafter, portions of the printed circuit board which it is desired to maintain rigid are masked off. The printed circuit board is then immersed into a solvent solution for the purpose of dissolving the stiffeners out of the exposed portions of a printed circuit board. The dissolving process is permitted to continue until the board has reached the desired point of flexibility. This point may be established by conventional physical chemistry computations or empirically by observing and flexing the board itself or a test strip of a similar substrate material.

When the desired degree of flexibility has been achieved the printed circuit board is removed from the solvent, cleaned, neutralized, and dried. Additional plating may be applied to the board at this time if desired or required. Thereafter the board is impregnated, by coating, potting, pressing or spraying, with an appropriate liquid agent such as one of the many epoxies or silicones well known in the trade which, in addition to its other desired characteristics, when dry, acts as a flexible solid to bond the flexible material of the original substrate. This original material, thus bonded, serves as the substrate for the flexible portion of the finished printed circuit board.

Dimensional stability of the portion of the printed circuit board underlying the printed circuit deposit itself is maintained by the structural integrity of the printed circuit conductor adhering to the substrate until the flexible bonding agent is added. This stability is enhanced by virtue of the fact that the substrate underlying the deposited conductor is the last material to be attacked by the solvent.

The nature of the invention will be more fully understood from the following detailed description:

In order to make a flexible printed circuit board or cable in accordance with this invention, a printed circuit board or cable is manufactured on a rigid substrate containing a flexible component such as glass fibers in accordance with any of the well known principles of manufacture. Presently, substantially all such boards utilize a substrate comprised of "Fiberglas" and epoxy in which the epoxy is soluble in an acid such as sulfuric acid. It should be understood, however, that the subject method is equally applicable to circuit boards based on any substrate of the class described. The rigid substrate printed circuit board has all the standard processing, such as drilling, printing, plating, etc. completed thereon.

For illustrative purposes the method of the subject invention will be described from this juncture as it is applied to an original rigid printed circuit board having a "Fiberglas" and epoxy substrate. The rigid substrate printed circuit board is next cleaned and any areas which are not to be converted to a flexible condition are masked off by a material which resists the solvent to be used; in the example chosen, sulfuric acid. A preferable sulfuric acid resistant masking material is "Teflon" tape.

The "Fiberglas" and epoxy printed circuit board is immersed in a concentrated sulfuric acid solution which is heated to an elevated temperature, preferably between 120° and 200° F.

The printed circuit board or cable is agitated in the acid until the desired amount of epoxy has been removed from the areas to be rendered flexible, leaving either the bare "Fiberglas" cloth or the cloth together with a desired residuum of bonding epoxy in those areas for maintaining dimensional stability of the printed circuit. The solvent will not attack the masked off areas or the areas underneath the conductors on the board before the unmasked areas attain the desired degree of flexibility. As stated earlier, the time at which to remove the circuit board from the solvent may be determined by calculation or empirically, by visually observing the flexibility of the board, by feeling same, with suitable protection for the fingers, or by using a test strip which is immersed simultaneously with the printed circuit board.

When the board reaches the desired flexible state, it is removed from the solvent, washed and then the surface is treated with a neutralizer for the solvent. Any commonly used alkali solution may be employed to neutralize the sulfuric acid used in the illustrative example. This step in the procedure prevents the solvent from further attacking the substrate.

At this time, additional plating may be done on the circuit conductors if desirable, or if the circuit conductors are affected to any extent by the solvent they may be replated. The commonly used conductive metals, such as copper and gold, are not affected by the sulfuric acid.

The circuit board is then again washed in distilled water and is heated in an oven until it is dry, and cooled.

The dried, flexible circuit board then may be potted, pressed or sprayed with any of the commonly available liquid agents which, on setting, provide a flexible solid bond with the remaining substrate material. This agent may be any one of a number of well known flexible epoxies or silicones. One of the silicones which has been found most suitable for the process is called "Adaprene L–100 Urethane Rubber." This is manufactured by the E. I. du Pont de Nemours & Company, Inc., of Delaware.

The resulting printed circuit board is flexible in those areas which have been treated with solvent. Since the board was initially manufactured with a rigid substrate, the dimensions and geometry of the printed circuit itself remain as accurate as they were when deposited on the original rigid substrate. Further, plating through holes to connect conductors on both sides of the flexible printed circuit board is no problem, and indeed is made possible here for the first time with a flexible substrate. Thus, by using the method of manufacture described, it is now possible to make a printed circuit board having any desired arrangement of regions of rigidity and regions of flexibility which can be held to the high standards of quality formerly only associated with fully rigid printed circuit boards.

There has accordingly been described and shown herein a novel, useful method and means of manufacturing a flexible printed circuit board.

What is claimed is:

1. A method of manufacturing a flexible printed circuit board from an original printed circuit board having a rigid substrate including a flexible material made rigid by a stiffening substance comprising:
   removing said stiffening substance from said underlying substrate in the areas of said original printed circuit board desired to be made flexible; and
   impregnating the underlying substrate in said areas with a flexible bonding agent to reinforce the flexible material within said areas.

2. A method of manufacturing a flexible printed circuit board from an original printed circuit board having a rigid substrate including a flexible material made rigid by a stiffening substance comprising:
   subjecting said rigid substrate to a solvent for said stiffening substance;
   purging said solvent from said substrate, leaving said flexible material;
   impregnating said substrate with a flexible bonding agent to reinforce said flexible material.

3. A method of manufacturing a flexible printed circuit board from an original printed circuit board having a rigid substrate including a flexible material made rigid by a stiffening substance comprising:

immersing said original printed circuit board in a solvent for said stiffening substance;
   removing said board from said solvent when said stiffening substance has been dissolved, leaving said flexible material in said substrate;
   purging said solvent from the now flexible board; and
   impregnating the substrate with a flexible bonding agent to reinforce said flexible material.

4. A method of making a flexible printed circuit board comprising:
   manufacturing an original printed circuit board on a substrate including a flexible material made rigid by a stiffening substance;
   removing said stiffening substance from said substrate; and
   impregnating the substrate with a flexible bonding agent to reinforce said flexible material.

5. A method of making a flexible printed circuit board comprising:
   manufacturing an original printed circuit board on a substrate including a flexible material made rigid by a stiffening substance;
   subjecting the areas of said substrate to be made flexible to a solvent for said stiffening substance;
   purging said solvent from said substrate, leaving said flexible material in said areas; and
   impregnating the substrate with a flexible bonding agent to reinforce said flexible material.

6. A method of making a flexible printed circuit board comprising:
   manufacturing an original printed circuit board on a substrate including a flexible material made rigid by a stiffening substance;
   masking the areas of said substrate not to be made flexible;
   immersing said original printed circuit board in a solvent for said stiffening substance;
   removing said board from said solvent when said stiffening substance has been dissolved, leaving said flexible material in the areas of the substrate to be made flexible;
   purging the solvent from the substrate; and
   impregnating the unmasked areas of the substrate with a flexible bonding agent to reinforce said flexible material.

7. A method of making a flexible printed circuit board from an original printed circuit board having a substrate including flexible glass fibers made rigid by an epoxy resin binder comprising:
   immersing said original printed circuit board in a solvent for said epoxy resin binder;
   removing said board from said solvent, leaving said glass fibers in said substrate;
   purging said solvent from the now flexible printed circuit board; and
   impregnating the substrate with a flexible bonding agent to reinforce said glass fibers.

8. The method described in claim 7 wherein said solvent comprises sulfuric acid at a temperature of between 120° and 200° Fahrenheit.

9. The method described in claim 7 wherein areas of said original printed circuit board desired to be kept rigid are masked with a solvent resisting material prior to immersing the original printed circuit board in said solvent.

10. A method of making a flexible printed circuit board from an original printed circuit board having a substrate including flexible glass fibers made rigid by an epoxy resin binder comprising:
   masking those areas of said original printed circuit board desired to be kept rigid with a solvent resisting material;
   immersing said original printed circuit board in a bath of concentrated sulfuric acid at an elevated temperature;
   agitating said original printed circuit board to remove the epoxy resin binder from the unmasked areas of said board desired to be rendered flexible;
removing the now flexible printed circuit board from said acid bath;
neutralizing and rinsing any acid remaining on said flexible printed circuit board;
drying said flexible printed circuit board; and
impregnating said flexible printed circuit board with a flexible bonding agent to reinforce said glass fibers.

References Cited

UNITED STATES PATENTS

| | | | |
|---|---|---|---|
| 2,943,956 | 7/1960 | Robinson | 117—212 X |
| 3,137,436 | 6/1964 | Moors et al. | 229—48 |

ALFRED A. LEAVITT, *Primary Examiner.*

A. M. GRIMALDI, *Assistant Examiner.*